(12) United States Patent
Frolov et al.

(10) Patent No.: US 8,187,906 B2
(45) Date of Patent: May 29, 2012

(54) METHOD FOR FABRICATING COMPOSITE SUBSTANCES FOR THIN FILM ELECTRO-OPTICAL DEVICES

(75) Inventors: Sergey Frolov, Murray Hill, NJ (US); Michael Cyrus, Summit, NJ (US)

(73) Assignee: Sunlight Photonics Inc., South Plainfield, NJ (US)

( * ) Notice: Subject to any disclaimer, the term of this patent is extended or adjusted under 35 U.S.C. 154(b) by 0 days.

(21) Appl. No.: 12/038,893

(22) Filed: Feb. 28, 2008

(65) Prior Publication Data

US 2009/0221111 A1 Sep. 3, 2009

(51) Int. Cl.
*H01L 31/18* (2006.01)
*B05D 5/12* (2006.01)

(52) U.S. Cl. ........ 438/65; 453/29; 453/66; 453/69; 453/80; 257/40; 257/431; 257/459; 257/E31.127; 156/350; 136/244; 136/251; 136/256; 136/263

(58) Field of Classification Search ........... 438/65; 257/E31.127; 427/58, 123
See application file for complete search history.

(56) References Cited

U.S. PATENT DOCUMENTS

| | | | |
|---|---|---|---|
| 2003/0010378 A1* | 1/2003 | Yoda et al. | 136/251 |
| 2004/0067324 A1 | 4/2004 | Lazarev et al. | |
| 2005/0088079 A1 | 4/2005 | Daniels | |
| 2006/0162770 A1* | 7/2006 | Matsui et al. | 136/263 |
| 2007/0036951 A1* | 2/2007 | Nguyen et al. | 428/209 |
| 2007/0065962 A1 | 3/2007 | Pichler | |
| 2007/0251570 A1* | 11/2007 | Eckert et al. | 136/256 |
| 2008/0216885 A1 | 9/2008 | Frolov et al. | |
| 2009/0173374 A1* | 7/2009 | Luch | 136/244 |

FOREIGN PATENT DOCUMENTS

| | | |
|---|---|---|
| JP | 57-153478 | 9/1982 |
| JP | 03-205879 | 9/1991 |
| JP | 2000-236105 | 8/2000 |
| JP | 2000-315530 | 11/2000 |
| JP | 2004-047825 | 2/2004 |
| JP | 2004-146425 | 5/2004 |
| JP | 2005-317225 | 11/2005 |
| JP | 2006-245507 | 9/2006 |
| KR | 10-1992-0007797 | 9/1992 |
| KR | 10-2008-03624 | 1/2001 |

OTHER PUBLICATIONS

E. Yablonovitch, "Ultra-Efficient Epitaxial Liftoff Solar Cells Exploiting Optical Confinement in the Wave Limit," NREL, Nov. 1999, SR-520-26903, 40 pages.

* cited by examiner

*Primary Examiner* — Hsien Ming Lee
*Assistant Examiner* — Walter H Swanson
(74) *Attorney, Agent, or Firm* — Stuart H. Mayer; Mayer & Williams P.C.

(57) ABSTRACT

A method is provided for producing an electro-optic device having at least one optically transparent conducting layer with low electrical resistance. The method includes providing a composite substrate that includes an optically transparent and electrically insulating base substrate and an electrically conducting grid disposed in grooves located in the base substrate. Also provided is an electro-optical module having at least one transparent conducting layer. The composite substrate is attached onto the electro-optic module such that electrical contact is established between the grid and the transparent conducting layer of the electro-optic module.

26 Claims, 12 Drawing Sheets

METHOD FOR FABRICATING COMPOSITE SUBSTANCES FOR THIN FILM ELECTRO-OPTICAL DEVICES

STATEMENT OF RELATED APPLICATIONS

This application is related to U.S. patent application Ser. No. 12/038,871, filed Feb. 28, 2008, entitled "Composite Substrates For Thin Film Electro-Optical Devices", which is incorporated by reference in its entirety herein.

FIELD OF THE INVENTION

The present invention relates generally to thin film electro-optic devices and methods of producing such devices. More particularly, the present invention relates to photovoltaic devices that have transparent conducting layers.

BACKGROUND OF THE INVENTION

A variety of electro-optic devices, including flat screen displays and photovoltaic devices, are currently produced in a large area thin film form. Such devices typically require thin layers of transparent conducting material. Significant improvements in the performance of these devices may be achieved by improving the optical and electrical characteristics of such transparent conducting layers. Furthermore, these devices are usually deposited on large area substrates. There is a continuing need to improve the performance of electro-optic devices by providing substrates having electrical and optical characteristics that are superior to those of currently available transparent conducting layers.

SUMMARY OF THE INVENTION

In accordance with the present invention, a method is provided for producing an electro-optic device having at least one optically transparent conducting layer with low electrical resistance. The method includes providing a composite substrate that includes an optically transparent and electrically insulating base substrate and an electrically conducting grid disposed in grooves located in the base substrate. Also provided is an electro-optical module having at least one transparent conducting layer. The composite substrate is attached onto the electro-optic module such that electrical contact is established between the grid and the transparent conducting layer of the electro-optic module.

In accordance with one aspect of the invention, the grid is optically nonblocking.

In accordance with one aspect of the invention, the electro-optic module comprises at least one photovoltaic module having first and second conductive layers and at least first and second semiconductor layers disposed between the conductive layers. The first and second semiconductor layers define a junction at an interface therebetween. At least one of the conductive layers is transparent.

In accordance with one aspect of the invention, the electro-optic module comprises a plurality of electro-optic modules, each having first and second conductive layers and at least first and second semiconductor layers disposed between conductive layers, and a plurality of composite substrates interposed on top of and between the modules.

In accordance with one aspect of the invention, a method is provided for reducing optical losses in electro-optic devices having at least one patterned metal grid. The method includes providing at least one composite substrate that includes a transparent and electrically insulating base substrate and a pattern of grooves disposed in the base substrate. The pattern of grooves matches the metal grid pattern. The composite substrate further includes an optically reflective material filling the grooves. The composite substrate is attached to the electro-optic device. The pattern of grooves is aligned on top of the metal grid pattern.

In accordance with one aspect of the invention, the filled grooves produce an optically non-blocking grid.

In accordance with one aspect of the invention, the optically reflective material is a conducting material.

In accordance with one aspect of the invention, an apparatus is provided for attaching a composite substrate with an embedded conducting grid onto an electro-optic device. The apparatus includes a pick and place system for handling the electro-optic device and an apparatus for depositing solder with a pattern matching a pattern defined by the embedded conducting grid. At least one pressure member is provided to exert a compression force for attaching the substrate onto the device. The apparatus also includes a heating element for solder reflow and an aligner system for positioning the substrate and the modules and aligning the pattern defined by the solder with the pattern defined by the embedded conducting grid.

In accordance with one aspect of the invention, a vacuum pump is provided for removing air when applying pressure to attach the substrate onto the device.

In accordance with one aspect of the invention, an apparatus is provided for attaching a composite substrate with an embedded conducting grid onto an electro-optic device. The apparatus includes a pick and place system for handling the device and an apparatus for depositing conducting epoxy with a pattern matching a pattern defined by the embedded conducting grid. At least one pressure member is provided to exert a compression force for attaching the substrate onto the device. A heating element is provided for curing the epoxy. An aligner system is provided for positioning the substrate and the modules and aligning the pattern defined by the epoxy with the pattern defined by the embedded conducting grid.

In accordance with one aspect of the invention, a process is provided for attaching a composite substrate with an embedded conducting grid onto an electro-optic device. The method begins by feeding a plurality of electro-optic modules through a first roll-to-roll arrangement. Each of the modules is a fully functional, thin-film electro-optic device. Each of the modules includes first and second conductive layers and at least first and second semiconductor layers disposed between the conductive layers. The first and second semiconductor layers define a junction at an interface therebetween. A plurality of composite substrates are fed through a second roll-to-roll arrangement. Each of the substrates is an optically transparent substrate with an conducting grid embedded therein. One of the modules is positioned and aligned over one of the composite substrates. The speed and temperature of the modules is monitored and maintained while being fed through the first roll-to-roll system. A compression force is exerted for attaching the module to the composite substrate.

DETAILED DESCRIPTION OF THE INVENTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

Embodiments of this apparatus and method may facilitate the ability to efficiently and economically convert electromagnetic energy in the form of light into electrical energy in the form of electrical current. Embodiments of this apparatus and method may also facilitate large volume production and widespread usage of photovoltaic devices.

Various large area electro-optic devices currently utilize thin-layers of optically transparent and electrically conductive materials. Most prominent examples of such electro-optic devices include photovoltaic devices and light emitting devices; both of these devices make use of so-called transparent conductive oxides (TCO) materials. A number of different TCO materials have been developed in recent years, including tin oxide, indium tin oxide (ITO), zinc oxide and others. All of these materials suffer from the same drawback: in order to increase their conductivity, material thickness or doping concentration has to be increased, which in turn lowers optical transmission trough this material due to excess absorption. The present invention provides a new approach circumventing this issue and avoiding the trade off between high electrical conductivity and high optical transmission.

As detailed below, the present invention provides a transparent substrate with an embedded electrically conductive material, which simultaneously achieves high electrical conductivity and high optical transmission. It also provides methods for how this composite substrate may be used in manufacturing of electro-optic devices, including photovoltaic and light emitting devices. The present invention further provides methods and processes of manufacturing such a substrate, as well as manufacturing of electro-optic devices using this substrate.

Electrically conducting materials may be embedded into a transparent substrate in the form of a grid and exposed on at least one side to provide electrical contacts. Large area electro-optic devices, such as photovoltaic devices, may be directly deposited on and attached to such a substrate, establishing an electrical contact between a conducting layer of the device and the conducting grid of the substrate. As a result, the contact resistance that may be achieved can be substantially lower than that currently achieved when a thin metal grid is directly deposited on top of the electro-optic device's conducting layer. The conducting grid may be shaped so that the amount of light it blocks is minimal, in some cases blocking no more light than when the aforementioned conventional direct metal grid deposition technique is employed. Furthermore, in some embodiments the cross-sectional shape of the conducting grid may be arranged so that it blocks none of the transmitted light.

EXAMPLES

Figure 1:
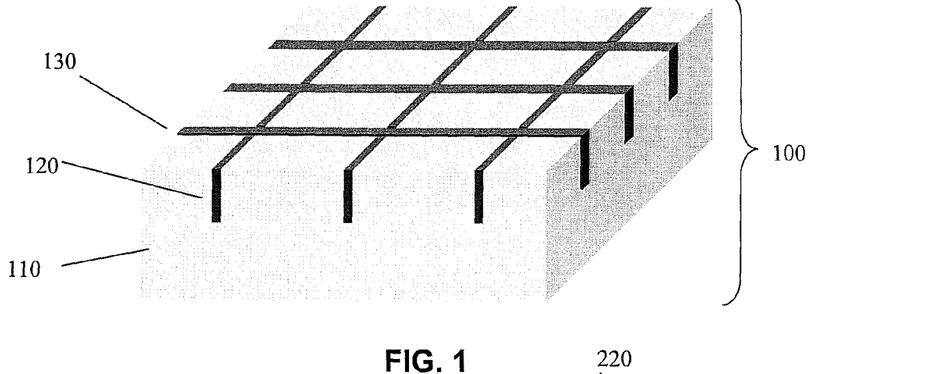
FIG. 1 is a perspective view of a transparent, electrically insulating substrate having a pattern of grooves filled with an electrically conducting grid.
Figure 2A:
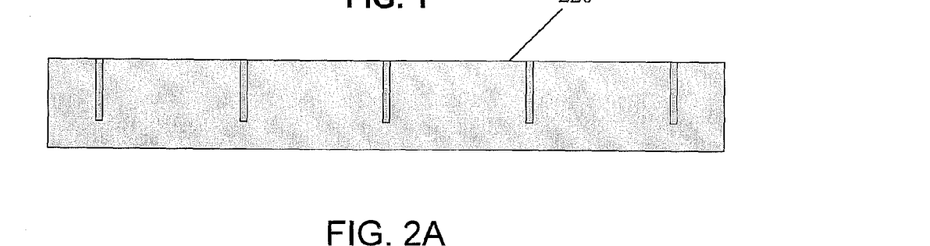
FIGS. 2A and 2B are cross-sectional and top views, respectively, of the transparent substrate depicted in FIG. 1.
Figure 2B:
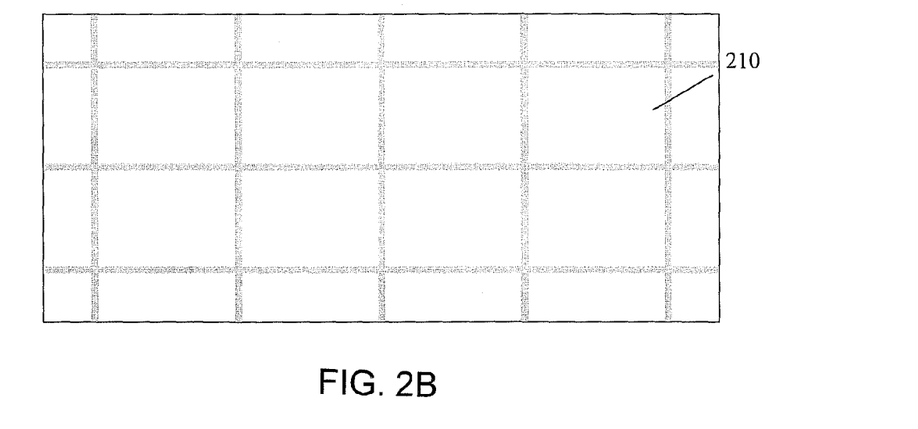
Figure 3A:
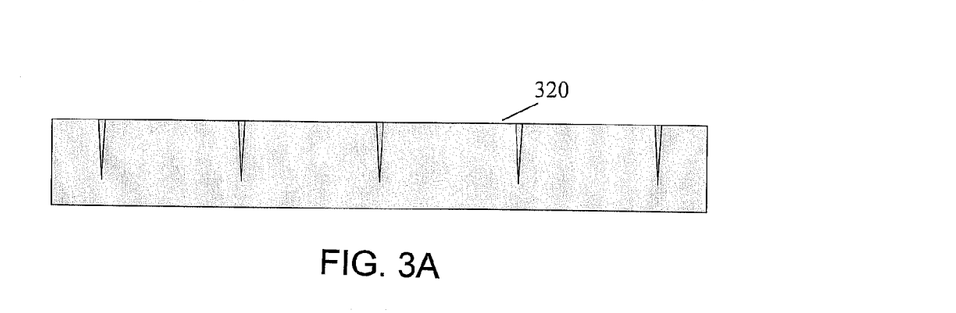
FIGS. 3A and 3B are cross-sectional and top views, respectively, of an alternative embodiment of the transparent substrate in which the grooves in which the grid is embedded have a triangular cross-sectional shape.
Figure 3B:
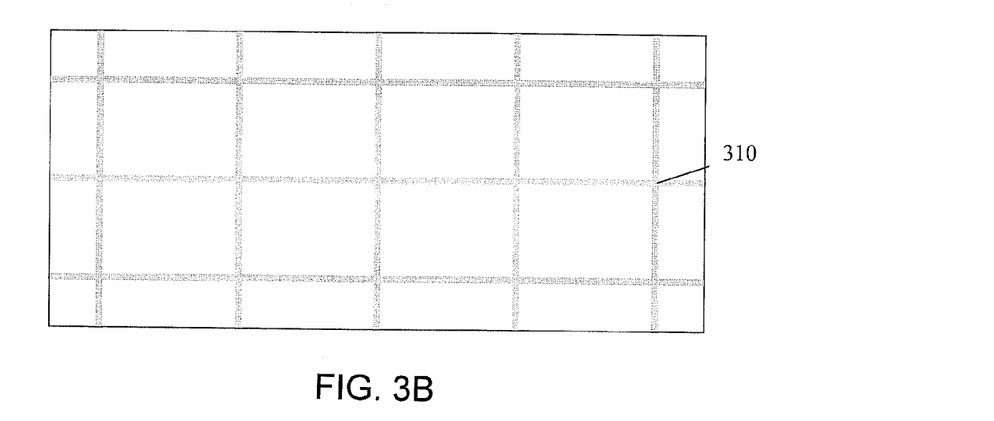

FIG. 2A is cross-sectional view of the composite substrate 100 of FIG. 1 and FIG. 2B is a top or plan view of the composite substrate 100. In this embodiment the grooves 220 have a rectangular cross-sectional shape. More generally, however, the cross-sectional shape of the grooves 220 may have any arbitrary shape, but preferably have an elongated shape with a longer dimension perpendicular to the top surface of the substrate 110. For example, FIGS. 3A and 3B show a cross-section and top view, respectively, of an embedded conducting grid 310 formed in grooves 320 that have a triangular cross-sectional shape. Examples of grooves 320 with different cross-sectional shapes are given in FIG. 4, including triangular (A), trapezoidal (B), rounded or convex (C), and concave (D).

In the embodiments shown in FIGS. 1-3, the conducting grids 310 have rectangular patterns, as seen in the top view of FIGS. 2B and 3B. However, other patterns may be used as well. For instance, as shown in the top view of FIGS. 5A-5D, the grids 310 may be arranged in straight lines(A), triangular lattices(B), hexagonal lattices(C) and sinusoidal patterns(D). Of course, other conducting grid arrangements, including arrangements not shown herein, may be used as well.

In another embodiment, the grooves in the transparent substrate may have cross-sectional shapes with re-entrant angles, i.e. shapes in which the groove's width below the substrate surface in some places may exceed the groove's width at the substrate surface. Examples of such grooves 620 are shown in FIGS. 6A-6E. A primary advantage of such grooves is that the conducting grid is held in place more firmly and may not even require adhesion between the inner surfaces of the grooves 620 and the conducting materials.

In another embodiment, the grooves in the transparent substrate may have cross-sectional shapes with re-entrant angles, i.e. shapes in which the groove's width below the substrate surface in some places may exceed the groove's width at the substrate surface. Examples of such grooves 620 are shown in FIGS. 6A-6E. A primary advantage of such grooves is that the conducting grid is held in place more firmly and may not even require adhesion between the inner surfaces of the grooves 620 and the conducting materials.

Figure 7:
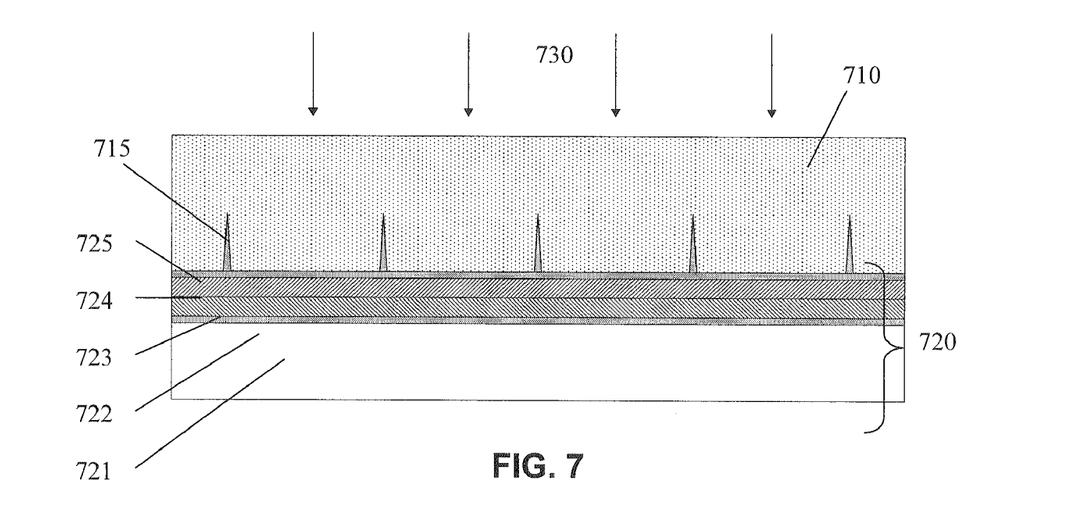
FIG. 7 is a cross-sectional view of a single p-n junction photovoltaic device that is attached to a transparent substrate having an embedded conducting grid.

In another embodiment, shown in cross-section in FIG. 7, a transparent substrate 710 with an embedded conducting grid having triangular grooves 715 is disposed on and attached to a photovoltaic device 720, which includes at least two conducting layers 722 and 725, and two semiconductor layers 723 and 724 forming a junction at their interface. Typically, such a junction is a p-n junction. There may be also a second substrate 721. In this embodiment light 730 is efficiently transmitted through substrate 710 and absorbed by the photovoltaic device 720, so that its energy can be converted into electrical current. The substrate 710 also makes electrical contact with the conducting layer 725, thereby significantly reducing in-series contact resistance of the photovoltaic device 720. One example of a photovoltaic or other electro-optic device that may be employed is formed from two or more photovoltaic or electro-optic modules and is disclosed in U.S. application Ser. No. 12/034,883 entitled "Multi-Layered Electro-Optic Devices," which is hereby incorporated by reference in its entirety.

Figure 21:
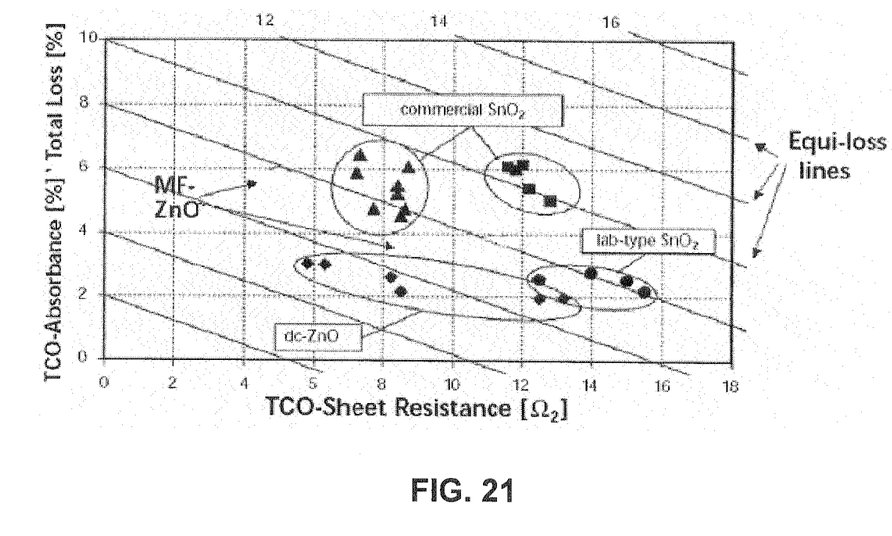
FIG. 21 is a plot of electrical and optical losses arising in various types of TCO films because of sheet resistance and optical absorbance.

Currently available large area transparent conducting materials have a resistivity in the range of $0.2 \cdot 10^{-3}$ to $1 \cdot 10^{-3}$ $\Omega$cm, which for films with a thickness in the range from 0.5 to 2 microns results in a sheet resistance of about 5 to 20 $\Omega$/square. This range of sheet resistances is often considered an optimum range, as shown in FIG. 21. Indeed, FIG. 21 shows that lowering the resistance of a transparent conducting oxide (TCO), e.g. by increasing its thickness, will result in increased optical losses due to absorption. On the other hand, further lowering of optical losses in a TCO is hindered by an accompanying increase in its electrical resistance.

Figure 4:
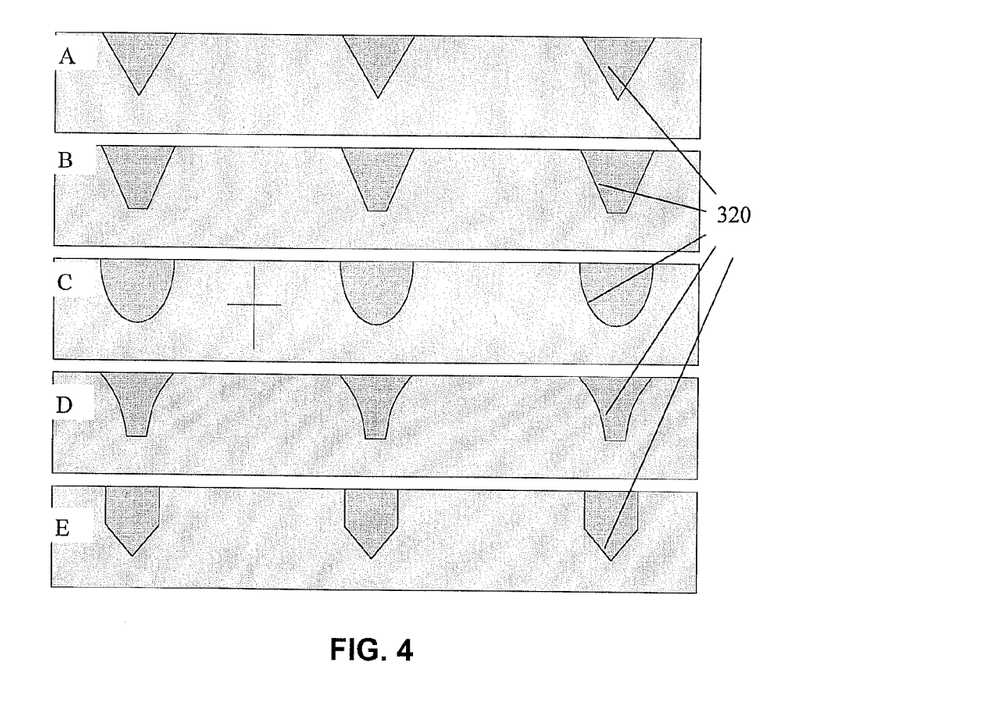
FIGS. 4A-4E show various examples of alternative cross-sectional shapes for the grooves formed in the transparent substrate.
Figure 5:
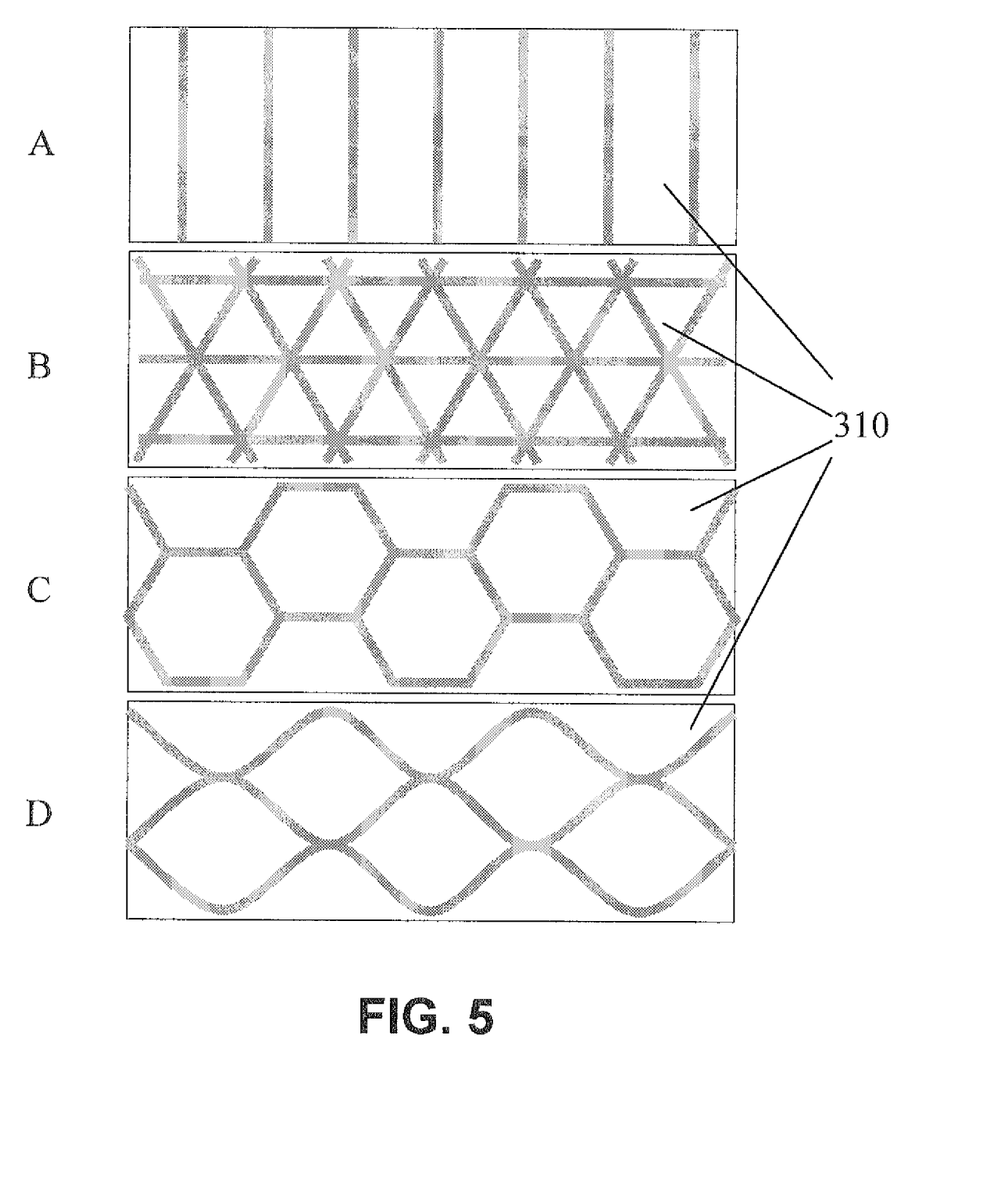
FIGS. 5A-5D show a top or plan view of various examples of alternative patterns in which the embedded conducting grid may be arranged, including straight line (FIG. 5A), triangular (FIG. 5B), hexagonal (FIG. 5C), and sinusoidal (FIG. 5D) patterns.
Figure 6:
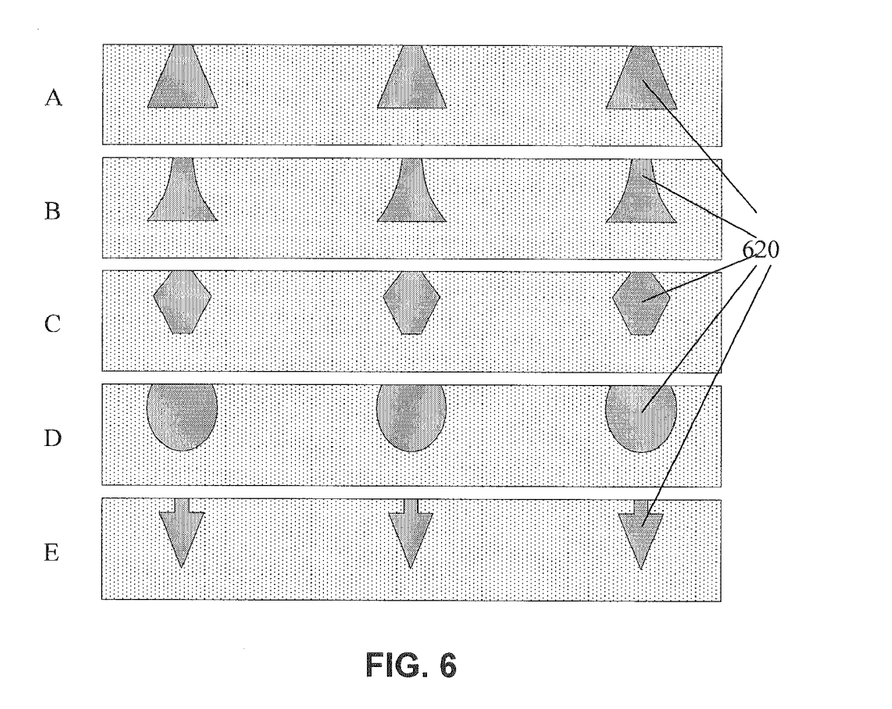
FIGS. 6A-6E show examples of alternative cross-sectional shapes for the grooves formed in the transparent substrate that all employ re-entrant angles.

As previously mentioned, the conducting grid may be formed in grooves having a wide variety of different cross-sectional shapes, including a rectangular shape such as shown in FIG. 2A and the other elongated shapes shown in FIGS. 4 and 6. An elongated shape will often be preferred because it minimizes the shading effect of the opaque conducting grid on the performance of the photovoltaic device that is disposed on the substrate. For example, for the same cross-sectional area of the conducting grid, a 20 µm wide metal grid will obscure and shade half of the area of the underlying photovoltaic device in comparison to a 40 µm wide metal grid.

As previously mentioned, the conducting grid may be formed in grooves having a wide variety of different cross-sectional shapes, including a rectangular shape such as shown in FIG. 2B and the other elongated shapes shown in FIGS. 4 and 6. An elongated shape will often be preferred because it minimizes the shading effect of the opaque conducting grid on the performance of the photovoltaic device that is disposed on the substrate. For example, for the same cross-sectional area of the conducting grid, a 20 µm wide metal grid will obscure and shade half of the area of the underlying photovoltaic device in comparison to a 40 µm wide metal grid.

Figure 8:
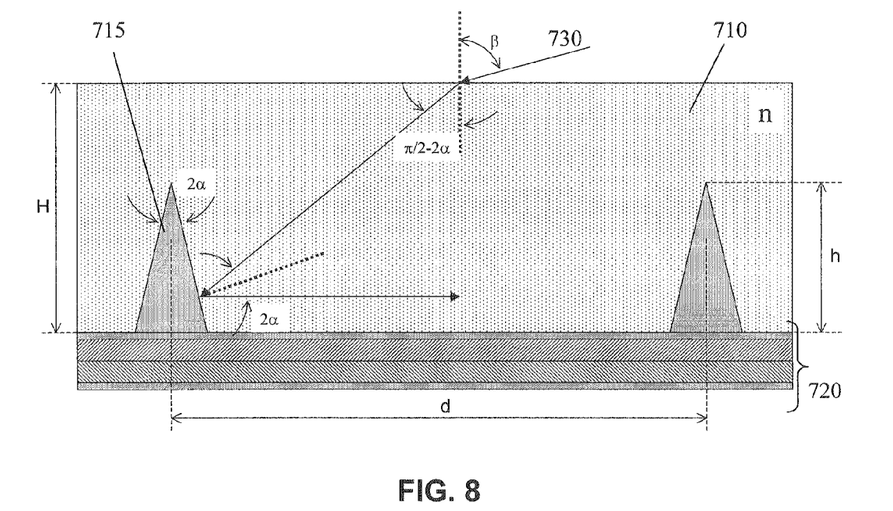
FIG. 8 shows a magnified cross-sectional view of the single p-n junction photovoltaic device and the substrate depicted in FIG. 7.

For the reasons explained below one particularly advantageous cross-section shape for the grooves formed in the substrate is a triangular shape. FIG. 8 shows a detailed cross-sectional view of the embodiment shown in FIG. 7 in which a photovoltaic module 720 is integrated with a substrate 710, where H is the substrate thickness, n is the substrates refractive index, h is the groove's height, d is the conducting grid pitch and $2\alpha$ is the angle at the apex of the triangular groove. Light 730 may come to the top surface of the substrate at any angle; however, only few light rays will intercept a groove 715 along their path. Furthermore, most of these rays will be reflected, so that they still pass through the underlying photovoltaic device. However, for incidence angles larger than a certain critical angle $\beta$ the light rays may be deflected away from the photovoltaic module as shown in FIG. 8. Assuming d>>h, the value of this critical angle is given by $$\beta = a\sin\{n\cos(2\alpha)\}. \tag{1}$$

Thus, it can be shown that for any given index n, there may be a range of angles $\alpha$, for which none of the rays satisfy Eq. (1) and therefore all of the light is transmitted through the substrate and absorbed by the underlying photovoltaic device:

$$2\alpha < a\cos(1/n). \tag{2}$$

For example, for n=2 one may find that α has to be less than 30° in order to have all of the light rays transmitted through the substrate. Conducting grids having such triangular grooves or other shaped grooves that transmit all the light through the substrate will be referred to herein as optically unobstructing or nonblocking conducting grids.

Based on the above analysis it follows that elongated triangular conducting grids embedded in a transparent substrate may be in many cases most suitable for simultaneous lowering electrical and optical losses (due to in-series resistance and optical transmission loss, respectively) in an integrated photovoltaic device, such as the device shown in FIG. 7. Indeed, it is theoretically possible to lower electrical resistance of a nonblocking conducting grid indefinitely without any penalizing decrease in optical transmission. Nonblocking and nearly nonblocking grids may be realized using grooves having a wide variety of cross-sectional shapes other than triangular cross-sectional shapes, e.g. the shapes shown in FIG. 4 and FIGS. 6C, 6D, and 6E.

Figure 9:
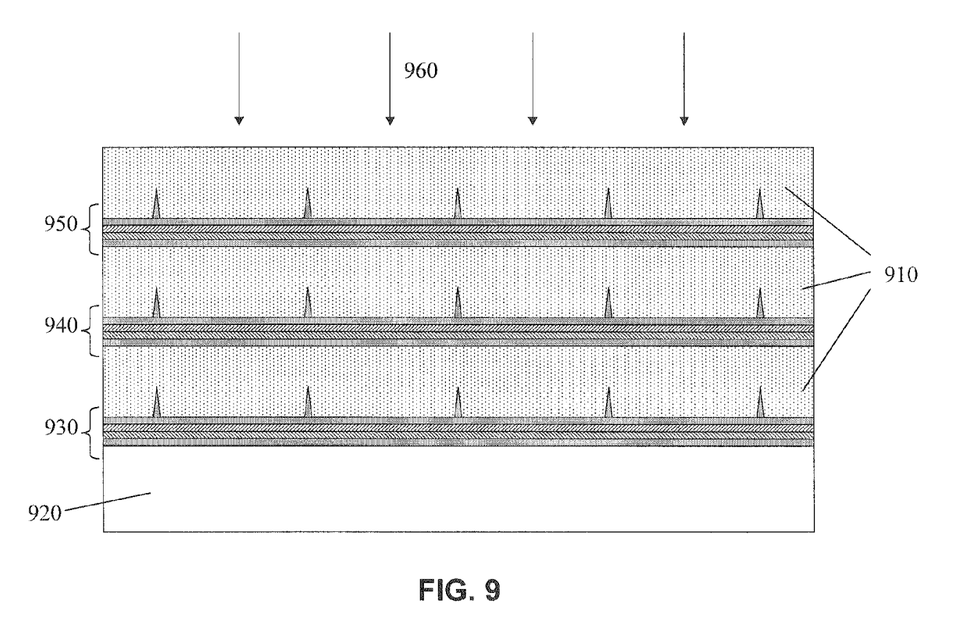
FIG. 9 is a cross-sectional view of a multi-junction photovoltaic device in which individual photovoltaic modules that each include a single junction are attached to a different transparent substrate each having an embedded conducting grid located on a single side of the substrate.

In another embodiment of the invention shown in FIG. 9, a multi-layered photovoltaic device is composed of three photovoltaic modules 930, 940 and 950 disposed on one another, each module consisting of at least two conducting layers, and two semiconductor layers forming a junction at their interface. Such modules are discussed in more details in the aforementioned U.S. application Ser. No. 12/034,883. The modules are separated and attached to electrically insulating, transparent substrates with embedded conducting grids 910 and further attached to a common substrate 920. Such a photovoltaic device may behave like a multi junction photovoltaic device, if the bandgaps of respective light-absorbing semiconductor layers in the modules differ from each other, so that the upper module's semiconductor bandgap is larger than that of a lower module. Typically, the power conversion efficiency of a multi junction photovoltaic device is higher than that of a single junction photovoltaic device. However, for this to occur the light transmission between the modules 930, 940 and 950 has to be nearly lossless or at least preferably greater than 80-90%. Yet, for the same reason it is desirable to have a low contact resistance for each of the modules. Unlike conventional approaches, when the substrates 910 are constructed in accordance with the principles of the present invention, both requirements concerning optical transmission and resistance can be satisfied.

Figure 10:
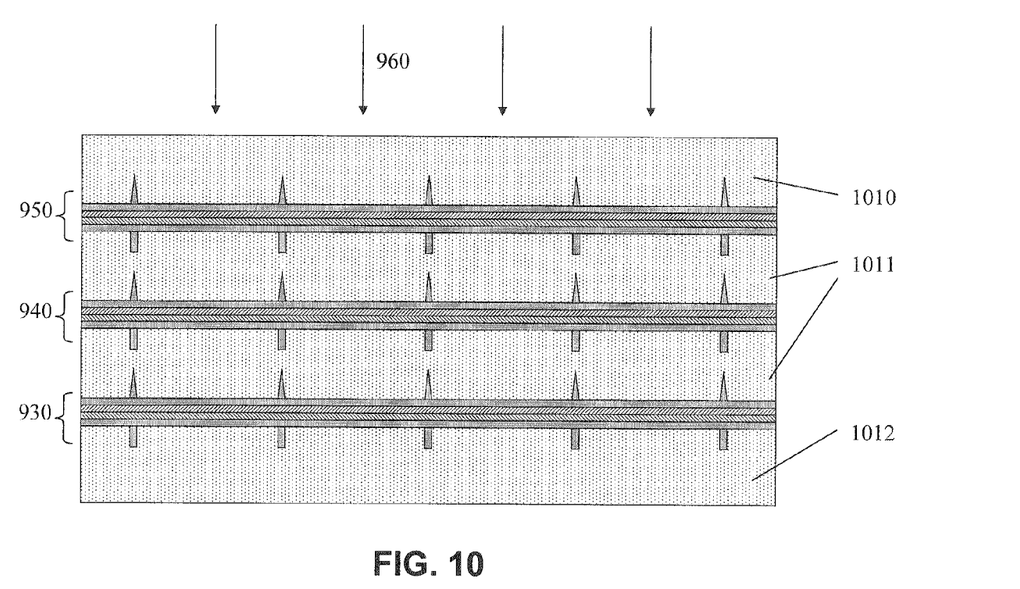
FIG. 10 is a cross-sectional view of a multi-junction photovoltaic device in which individual photovoltaic modules that each include a single junction are attached to a different transparent substrate each having an embedded conducting grid on both sides of the substrate.
Figure 11:
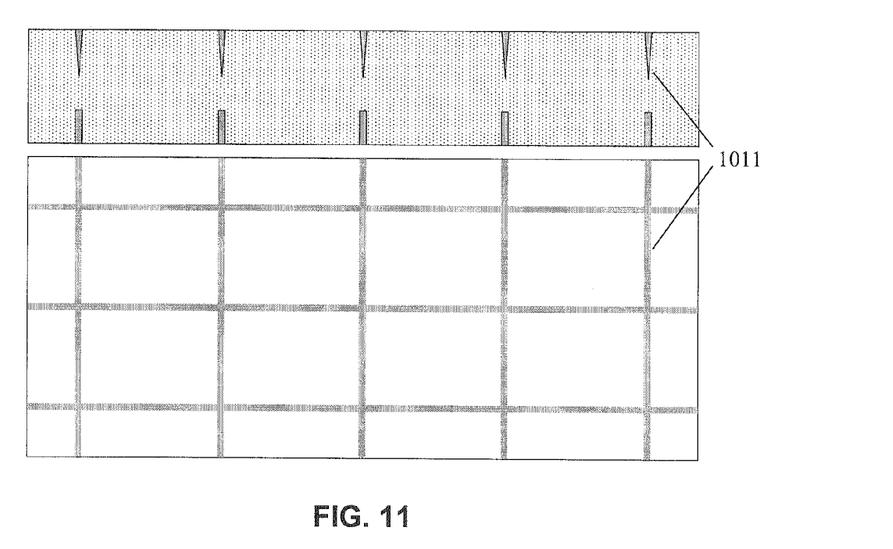
FIGS. 11a and 11b show a cross-sectional and top view, respectively, of one example of a transparent substrate having an embedded conducting grid with a triangular cross-section on its upper side and an embedded conducting grid having a rectangular cross-section on its bottom side.

In another embodiment, the device in FIG. 9 is modified so that substrates 910 and 920 are replaced with a different set of substrates 1010, 1011, and 1012 of the type shown in FIG. 10. In this particular case substrate 1010 and 1012 are largely the same as the previously described substrate 910, in which there is a single embedded conducting grid disposed on one side of the substrate 910. Substrates 1011, however, have two conducting grids disposed on opposite sides of the substrate 1011. Substrate 1011 is also shown in a cross-sectional and top view, respectively, in FIG. 11. In this embodiment, the conducting grids disposed on each side of the substrate are used to lower the contact resistance of conducting layers in neighboring modules. By separating each module in the photovoltaic device with such a substrate the contact resistance of both conducting layers in each module can be reduced.

Figure 12:
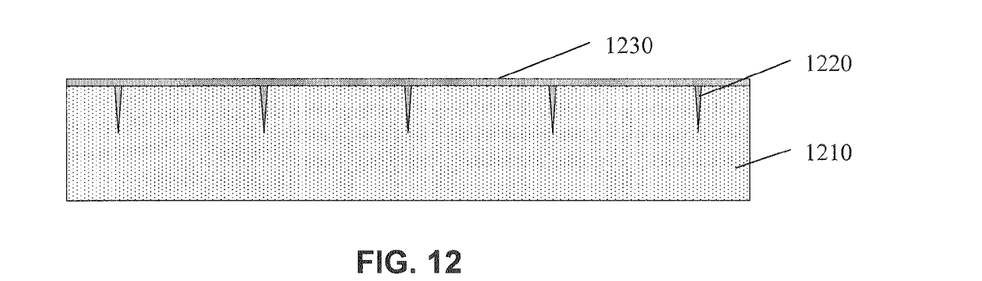
FIG. 12 shows a cross-sectional view of a transparent substrate having an embedded metal grid with conducting elements having a triangular cross-sectional shape and a transparent conducting layer covering its upper surface.

In another embodiment shown in FIG. 12 an insulating, transparent substrate 1210 having an embedded conducting grid 1220 is further coated with a thin layer of transparent conductor 1230, e.g. ITO. Such a substrate may be used as a base layer in a subsequent manufacturing of a thin-film photovoltaic device. That is, at least two semiconductor layers and an additional conducting layer may be sequentially deposited or grown directly on top of the conducting layer 1230.

Figure 13:
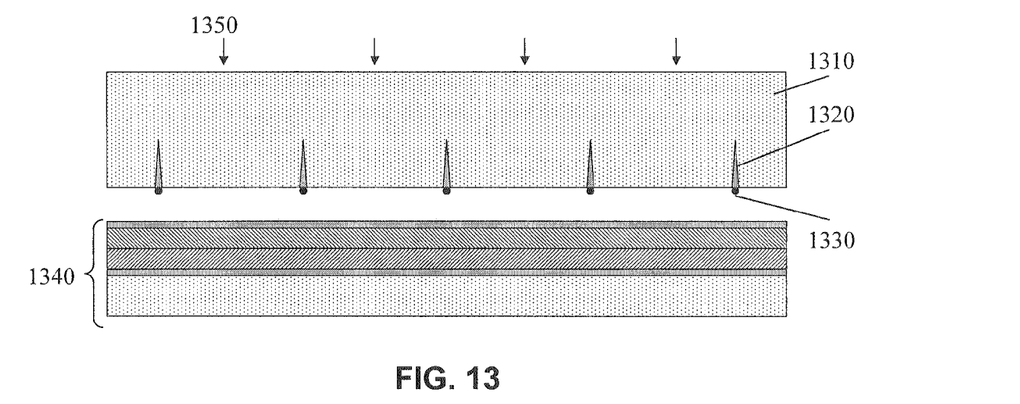
FIG. 13 depicts a process in which a transparent substrate having an embedded conducting grid with conducting elements having a triangular cross-sectional shape is attached to the upper conductive layer of a single junction photovoltaic device.

In another embodiment shown in FIG. 13 an insulating, transparent substrate 1310 having an embedded conducting grid 1320 is hybridly attached to a photovoltaic module 1340. Solder or conductive epoxy bumps 1330 may be used for adhering the module 1340 to the substrate 1310 and for producing good electrical contacts between the conducting grid 1320 and the top conducting layer of the module 1340. FIG. 13 also shows the direction of incoming light 1350 that may be used for efficient power conversion by the photovoltaic module 1340.

Figure 14:
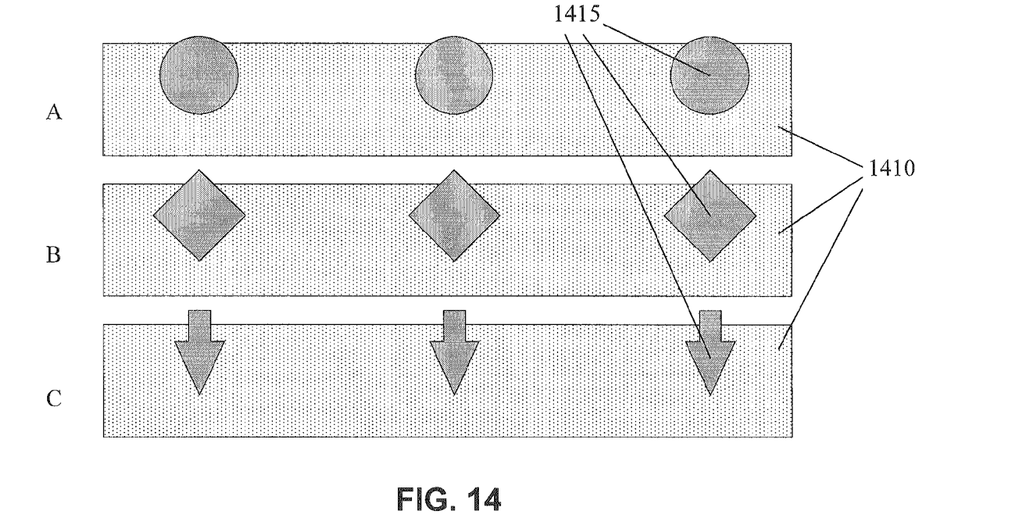
FIGS. 14A-14C show in cross-section alternative examples of the conducting grid in which a portion of each individual conducting element protrudes above the substrate surface.

In another embodiment shown in cross-section in FIG. 14 an insulating, transparent substrate 1410 has an embedded conducting grid 1415 with a variety of cross-sectional shapes. In this example a part of the grid located in each groove extends above the top surface of the substrate.

Figure 15:
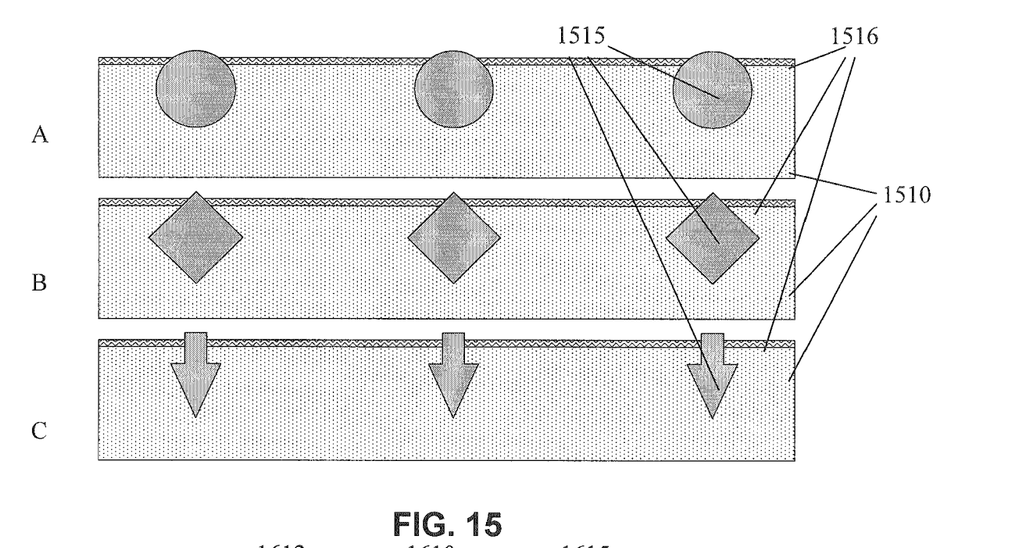
FIGS. 15A-15C show in cross-section alternative examples of the conducting grid in which a portion of each individual conducting element protrudes above the substrate surface and in which a thin layer of a transparent adhesive is applied between the individual conducting elements.

In another embodiment shown in FIG. 15 an insulating, transparent substrate 1510 has an embedded conducting grid 1515 with a variety of cross-sectional shapes, a part of which may extend above the top surface of the substrate. Furthermore, the exposed parts of the substrate may be coated with a thin layer of a transparent adhesive 1516.

Figure 16:
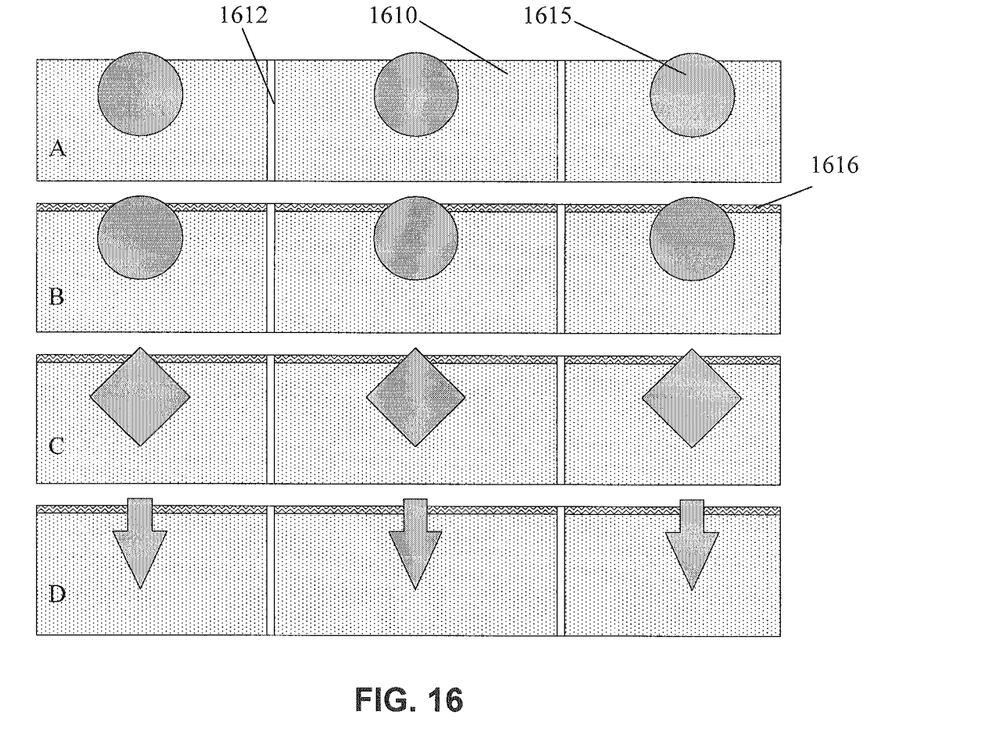
FIGS. 16A-16D show in cross-section examples of a perforated transparent substrate with an embedded conducting grid that is formed from circular wire conducting elements, (FIG. 16A), circular wire conducting elements and an adhesive layer (FIG. 16B), square wire conducting elements with an adhesive layer (FIG. 16C), and arrow-type wire conducting elements with an adhesive layer (FIG. 16D).

In another embodiment shown in FIG. 16 an insulating, transparent substrate 1610 has an embedded conducting grid 1615 with a variety of cross-sectional shapes, a part of which may extend above the top surface of the substrate. Furthermore, the exposed parts of the substrate may be coated with a thin layer of a transparent adhesive 1616. In this embodiment the substrate is perforated so that there are multiple through holes 1612 allowing air passage from one side of the substrate to the other. In some embodiments these holes may be cylindrical in shape, disposed evenly between the grid wires and have a diameter of about 0.05-0.5 mm. The through holes may serve to facilitate the attachment of the substrate to the photovoltaic module, as discussed in more detail below in connection with FIG. 17.

Figure 17:
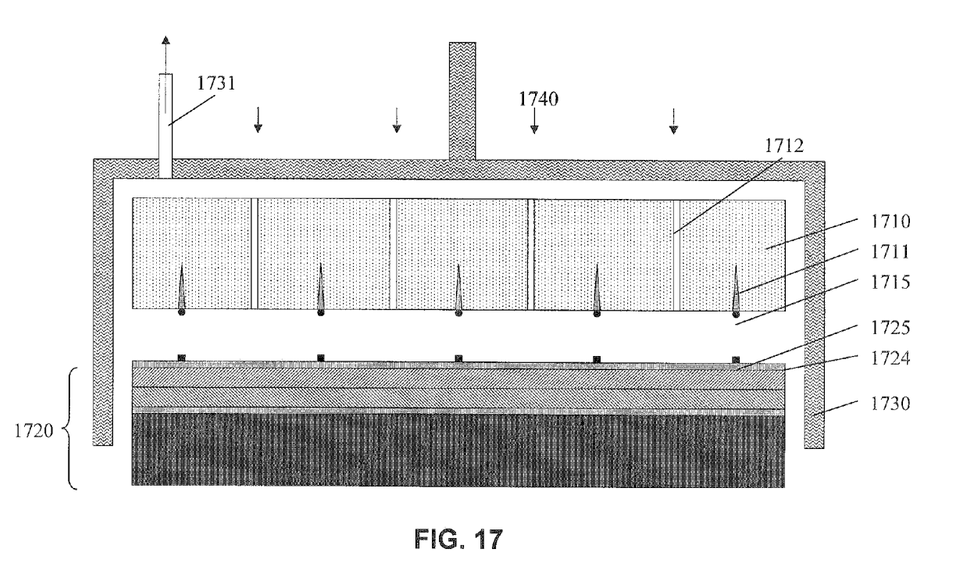
FIG. 17 shows one example of an apparatus for attaching a transparent substrate having an embedded conducting grid with conducting elements that have a triangular cross-section shape to the upper conductive surface of a single junction photovoltaic device.

In another embodiment shown in FIG. 17, an apparatus is provided to implement a method for attaching in a hybrid manner a perforated, insulating, transparent substrate 1710 having an embedded conducting grid 1711 onto an exposed conducting layer 1724 of a photovoltaic module 1720. Solder bumps or conducting epoxy 1715 and 1725 may be disposed on the grid 1711 and the module 1720, respectively. The substrate 1710 may then be attached to the module 1720 by using a laminator 1730 to apply pressure, as indicated by reference numeral 1740. The laminator 1730 may also use local heating to raise the temperature of the substrate-module assembly to either reflow the solder bumps or cure the epoxy, thereby bonding the substrate 1710 to the module 1720. This attachment process may be assisted with a vacuum pump 1731, which removes air from the laminator cavity. Since the substrate is perforated with through holes 1712, air can escape from underneath the substrate during the attachment process, thus leading to a very close contact and strong bond between the corresponding surfaces.

Figure 18:
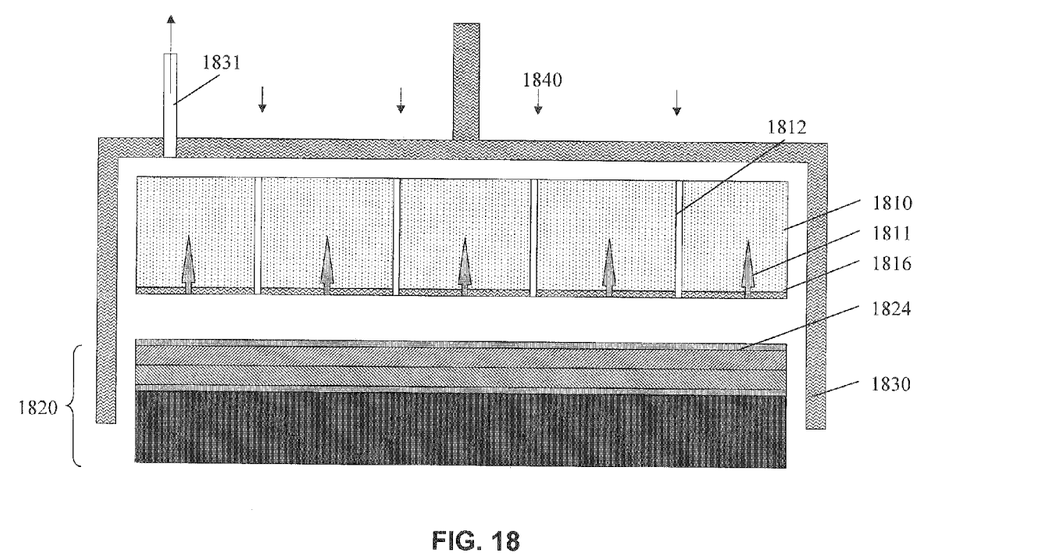
FIG. 18 is an example of an apparatus for attaching a transparent substrate having an embedded conducting grid with conducting elements that have an arrow-type cross-section and an adhesive layer to the upper conductive surface of a single junction photovoltaic device.

In another embodiment shown in FIG. 18, an apparatus is provided to implement a method for attaching in a hybrid manner a perforated, insulating, transparent substrate 1810 having an embedded conducting grid 1811 onto an exposed conducting layer 1824 of a photovoltaic module 1820. In this embodiment an additional transparent adhesive layer 1816 may be disposed on the substrate 1810. The substrate 1810 may then be attached to the module 1820 using a laminator 1830 to apply pressure, as indicated by reference numeral 1840. The laminator 1830 may also use local heating to raise the temperature of the assembly and activate the adhesive layer, thereby bonding the substrate to the module. This attachment process may be assisted with a vacuum pump 1831, which removes air from the laminator cavity. The through holes 1812 in the substrate 1810 allow air to escape from underneath the substrate 1810 during the attachment process, thus leading to a very close contact and strong bond between the corresponding surfaces.

Figure 19:
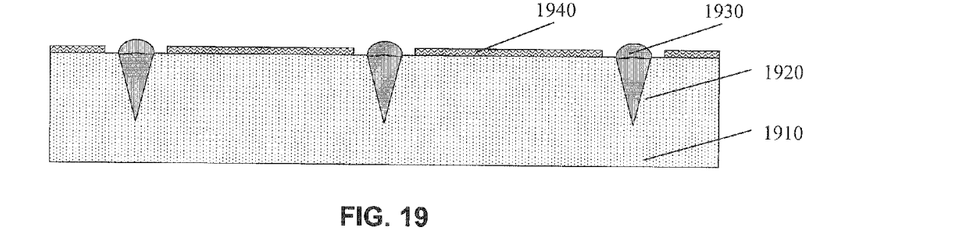
FIG. 19 shows in cross-section a transparent substrate having an adhesive layer and grooves having the cross-sectional shape of an arrow, which grooves are filled with conductive ink.

In another embodiment shown in FIG. 19 a method is provided for manufacturing a transparent substrate with an embedded conducting grid. A flexible clear polymer substrate 1910 is shown in cross-section, which may be used as a starting material. The thickness range for this substrate may be between 20 microns and 1 mm. A pattern of grooves 1920 may be produced in the top of the substrate 1910 by either photolithographic etching or micro-stamping. The shape of the grooves in cross-section is triangular and elongated along the axis perpendicular to the substrate surface with an apex angle of less than 60°. The grooves 1920 may then be filled with a nanoparticle silver ink 1930, for example using the ink-jet printing, and cured, so that a part of the silver ink, which defines the conducting grid, is exposed and protrudes from the top surface of the substrate 1910. Furthermore, a thin layer (10-50 microns) of adhesive 1940, such as ethylene-vinylacetate (EVA), may be deposited on the substrate 1910 between the individual grid wires, which may be subsequently used to attach the substrate to a photovoltaic module.

In yet another embodiment shown in a cross-sectional and top view in FIGS. 20A and 20B, respectively, an alternative method is employed for manufacturing a transparent substrate with an embedded conducting grid. In this case a clear glass substrate 2010 with a thickness in the range between 50 microns and 2000 mm may be used. A pattern of rectangular grooves 2020 may then be produced in the substrate 2010, using for example, either glass molding or photolithographic dry etching techniques. Subsequently, a first set of cylindrically shaped metal wires 2030 may be placed in the grooves, followed by a second set of metal wires 2040 that are oriented in the orthogonal direction with respect to the first set of metal wires 2030. The metal material in the wires could be gold or copper, and the wire diameter could be in the range of 25-100 microns, for instance. The width of the grooves 2020 may be chosen to be about equal to the diameter of the wires and the depth of the grooves 2020 may be chosen so that the top set of wires 2040 slightly protrude above the surface of the substrate 2010.

Figure 20:
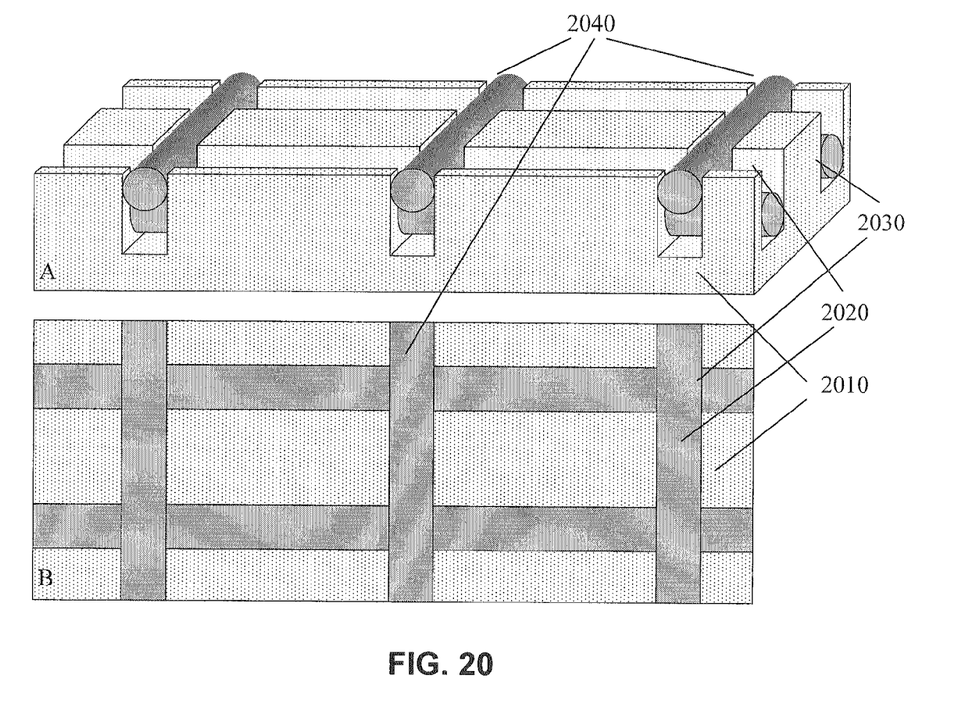
FIG. 20A is a perspective view and FIG. 20B is a top view of a transparent substrate having grooves filled with a first set of cylindrical wires extending in one direction and a second set of cylindrical wires extending in another direction which are situated above the first set of wires.

In yet another embodiment, the cross-sectional shape of the grooves 2020 shown in FIG. 20 may be modified so that they are similar in shape to the grooves shown in FIG. 4E so that most of the light may be transmitted through the substrate unimpeded. Furthermore, the apex angle may be chosen so that the resulting conducting grid is nonblocking.

In yet another embodiment, an adhesive is added into the grooves 2020 shown in FIG. 20 in order to secure the wires within the grooves and thus attach them to the substrate 2010.

Figure 22:
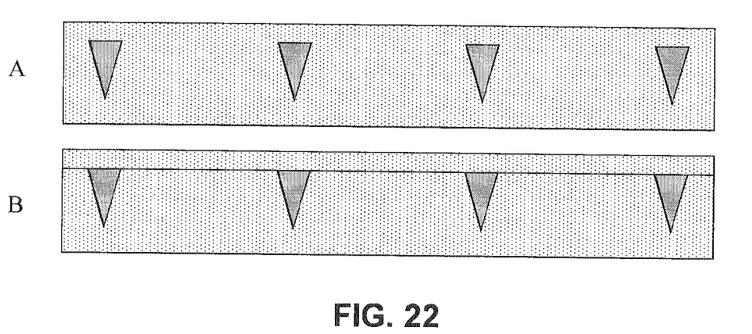
FIGS. 22A and 22B are cross-sectional views of two embodiments of a transparent substrate in which the conducting grids are fully embedded.

In yet another embodiment shown in 22A and 22B the transparent substrates A and B, which have nonblocking reflecting grids, may be used to improve optical transmission through an electro-optical device by providing a pattern-matching metal grid on its top surface. When one of such substrates is attached to the top surface of the electro-optic device, its nonblocking reflecting grid will reflect and redirect light rays away from the metal grid, thereby reducing optical losses. Nonblocking reflecting grids may be produced from any reflecting material, including conducting materials and not excluding insulating and semiconducting materials. Furthermore, substrate B in FIG. 22B may be a laminate film composed of at least two layers.

Figure 23:
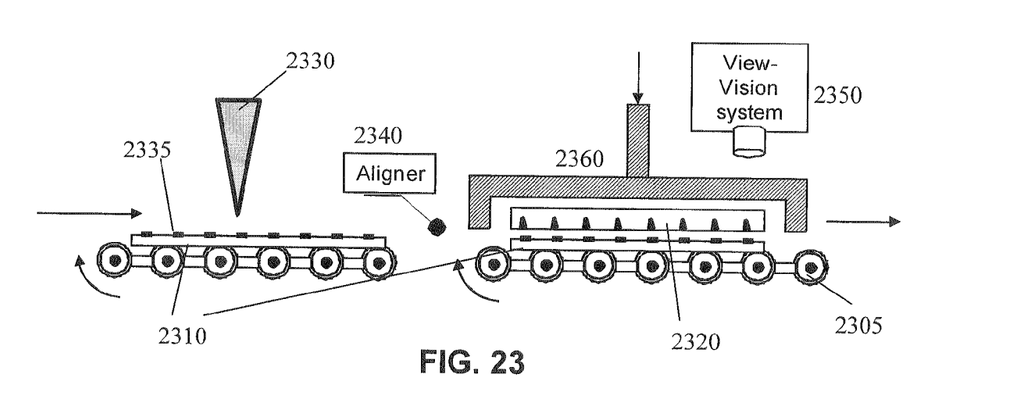
FIG. 23 is a schematic diagram of an apparatus for attaching a composite substrate onto an electro-optic device.

FIG. 23 shows another embodiment of an apparatus that implements a method for attaching a composite substrate to an electro-optic device. A pick and place arrangement or a roller system 2305 may be used to handle electro-optic devices 2310 in this example. A soldering tool 2330 may be used to deposit a pattern of either solder or conducting epoxy bumps 2335 onto the electro-optic devices 2310. An aligner system 2340, with the aid of a view-vision system 2350 may be used to align composite substrate 2320 with the electro-optic device 2310. A pressure member may then exert the necessary heat and force to melt the bumps 2335 and bond substrate 2320 to device 2310.

Variations of the apparatus and method described above are possible without departing from the scope of the invention.

The invention claimed is:

1. A method of producing an electro-optical device having at least one optically transparent conducting layer with low electrical resistance comprising the steps of:
  providing a composite substrate that includes an optically transparent and electrically insulating base substrate and an electrically conducting grid disposed in grooves located in the base substrate, said electrically conducting grid being optically nonblocking such that all light coming to a top surface of the composite substrate at any angle is transmitted through the composite substrate without being blocked by said optically nonblocking grid;
  providing an electro-optical module having at least one transparent conducting layer; and attaching said composite substrate onto said electro-optical module such that electrical contact is established between said grid and said transparent conducting layer of the electro-optical module.

2. The method of claim 1 wherein said electro-optical module comprises at least one photovoltaic module having first and second conductive layers and at least first and second semiconductor layers disposed between the first and second conductive layers, said first and second semiconductor layers defining a junction at an interface therebetween, at least one of said first and second conductive layers being transparent.

3. The method of claim 1 wherein said electro-optical module comprises a plurality of electro-optical modules disposed on one another, each electro-optical module having first and second conductive layers and at least first and second semiconductor layers disposed between the first and second conductive layers, and a plurality of composite substrates interposed on top of and between said modules.

4. A method of reducing optical losses in an electro-optical device having at least one patterned metal grid comprising the steps of:
  providing at least one composite substrate that includes a transparent and electrically insulating base substrate and a pattern of grooves disposed in said base substrate, said pattern of grooves matching said patterned metal grid, wherein said composite substrate further includes an optically reflective material filling said grooves; and
  attaching said composite substrate onto said electro-optical device and aligning said pattern of grooves on top of said patterned metal grid.

5. The method of claim 4 wherein said filled grooves produce an optically non-blocking grid.

6. The method of claim 4 wherein said optically reflective material is a conducting material.

7. A method of producing a composite substrate comprising the steps of:

producing a pattern of grooves in an optically transparent and electrically insulating substrate; and producing an embedded optically nonblocking conducting grid by filling said grooves with an electrically conducting material, said optically nonblocking grid being optically nonblocking such that all light coming to a top surface of the composite substrate at any angle is transmitted through the substrate without being blocked by said optically nonblocking grid.

8. The method of claim 7 wherein at least one of said grooves has a triangular cross-section.

9. The method of claim 7 wherein the conducting material protrudes above a surface of said substrate.

10. The method of claim 7 wherein the conducting material is a conducting ink.

11. The method of claim 7 wherein the conducting material is a conducting polymer.

12. The method of claim 7 wherein the conducting material is a metal.

13. The method of claim 7 further comprising depositing a layer of transparent adhesive onto said substrate.

14. The method of claim 7 further comprising producing a plurality of holes through said substrate.

15. The method of claim 7 further comprising depositing a transparent conducting layer to establish electrical contact with said grid.

16. The method of claim 7 wherein said substrate is a glass substrate.

17. The method of claim 7 wherein said substrate is a polymer substrate.

18. The method of claim 4 wherein the grooves have a cross-sectional shape with re-entrant angles.

19. A method of producing a composite substrate comprising the steps of:
    producing a pattern of grooves in an optically transparent and electrically insulating substrate; and
    producing an embedded conducting grid by filling said grooves with a plurality of cylindrically shaped metal wires.

20. The method of claim 19 wherein at least one of said grooves has a triangular cross-section.

21. The method of claim 19 wherein a conducting material protrudes above a surface of said substrate.

22. The method of claim 19 wherein the conducting material is a metal.

23. The method of claim 19 further comprising depositing a layer of transparent adhesive onto said substrate.

24. The method of claim 19 further comprising producing a plurality of holes through said substrate.

25. The method of claim 19 wherein said substrate is a glass substrate.

26. The method of claim 19 wherein said substrate is a polymer substrate.

* * * * *

UNITED STATES PATENT AND TRADEMARK OFFICE
CERTIFICATE OF CORRECTION

| | | |
|---|---|---|
| PATENT NO. | : 8,187,906 B2 | Page 1 of 1 |
| APPLICATION NO. | : 12/038893 | |
| DATED | : May 29, 2012 | |
| INVENTOR(S) | : Sergey Frolov and Michael Cyrus | |

It is certified that error appears in the above-identified patent and that said Letters Patent is hereby corrected as shown below:

Title page, item (54) and Col. 1, after "Composite" change "Substances" to --Substrates--.

Signed and Sealed this
Twenty-eighth Day of August, 2012

David J. Kappos
*Director of the United States Patent and Trademark Office*